(12) United States Patent
Chen et al.

(10) Patent No.: US 12,040,377 B2
(45) Date of Patent: **\*Jul. 16, 2024**

(54) SEMICONDUCTOR DEVICE, FERROELECTRIC CAPACITOR AND LAMINATED STRUCTURE

(71) Applicant: TAIWAN SEMICONDUCTOR MANUFACTURING COMPANY LTD., Hsinchu (TW)

(72) Inventors: Ying-Chih Chen, Hsinchu (TW); Blanka Magyari-Kope, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/192,681

(22) Filed: Mar. 30, 2023

(65) Prior Publication Data
US 2023/0246087 A1    Aug. 3, 2023

Related U.S. Application Data

(63) Continuation of application No. 17/160,013, filed on Jan. 27, 2021, now Pat. No. 11,621,337.

(51) Int. Cl.
*H01L 29/51*  (2006.01)
*H01L 29/78*  (2006.01)
*H01L 49/02*  (2006.01)

(52) U.S. Cl.
CPC ............ *H01L 29/513* (2013.01); *H01L 28/55* (2013.01); *H01L 28/60* (2013.01); *H01L 29/516* (2013.01); *H01L 29/78391* (2014.09)

(58) Field of Classification Search
CPC .............. H01L 29/513; H01L 29/516; H01L 29/78391; H01L 29/40111; H01L 28/75; H01L 28/60; H01L 28/55
See application file for complete search history.

(56) References Cited

U.S. PATENT DOCUMENTS 11,621,337 B2 * 4/2023 Chen ................... H01L 28/75
257/295
2021/0313439 A1 * 10/2021 Lee ..................... H01L 29/4908

* cited by examiner

*Primary Examiner* — Jose R Diaz
(74) *Attorney, Agent, or Firm* — WPAT LAW; Anthony King

(57) ABSTRACT

A semiconductor device includes a gate stack and a channel layer over the gate stack. The gate stack includes a metal gate electrode, a ferroelectric layer, and a semiconducting oxide layer disposed between the ferroelectric layer and the metal gate electrode. The semiconducting oxide layer includes $SrRuO_3$, InGaZnO (IGZO) or LaSrMnO.

20 Claims, 9 Drawing Sheets

SEMICONDUCTOR DEVICE, FERROELECTRIC CAPACITOR AND LAMINATED STRUCTURE

CROSS-REFERENCE TO RELATED APPLICATIONS

This application is a continuation of U.S. application Ser. No. 17/160,013, filed on Jan. 27, 2021. The above-referenced application is hereby incorporated herein by reference in their entirety.

BACKGROUND

Typically, integrated circuits (ICs) include a considerable amount of circuit elements formed on a given area of a chip. The circuit element is represented by a semiconductor device. For example, current advanced ICs are formed by millions of field effect transistors (FETs), which are also referred to as metal-oxide-semiconductor (MOS) transistors or MOSFETs. In general, MOSFETs may be considered as dominant semiconductor devices in modern ICs. A ferroelectric field-effect transistor (Fe FET) is a type of FET that includes a ferroelectric material sandwiched between the gate electrode and source-drain conduction region of the device. Permanent electrical field polarization in the ferroelectric causes this type of device to retain the transistor's state (on or off) in the absence of any electrical bias. FeFET based devices are used in FeFET memory that is a type of single transistor non-volatile memory. Hence, it is desirable to provide a semiconductor device with incorporated ferroelectric materials in good compatibility with standard manufacturing techniques and without deteriorated performance of fabricated semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
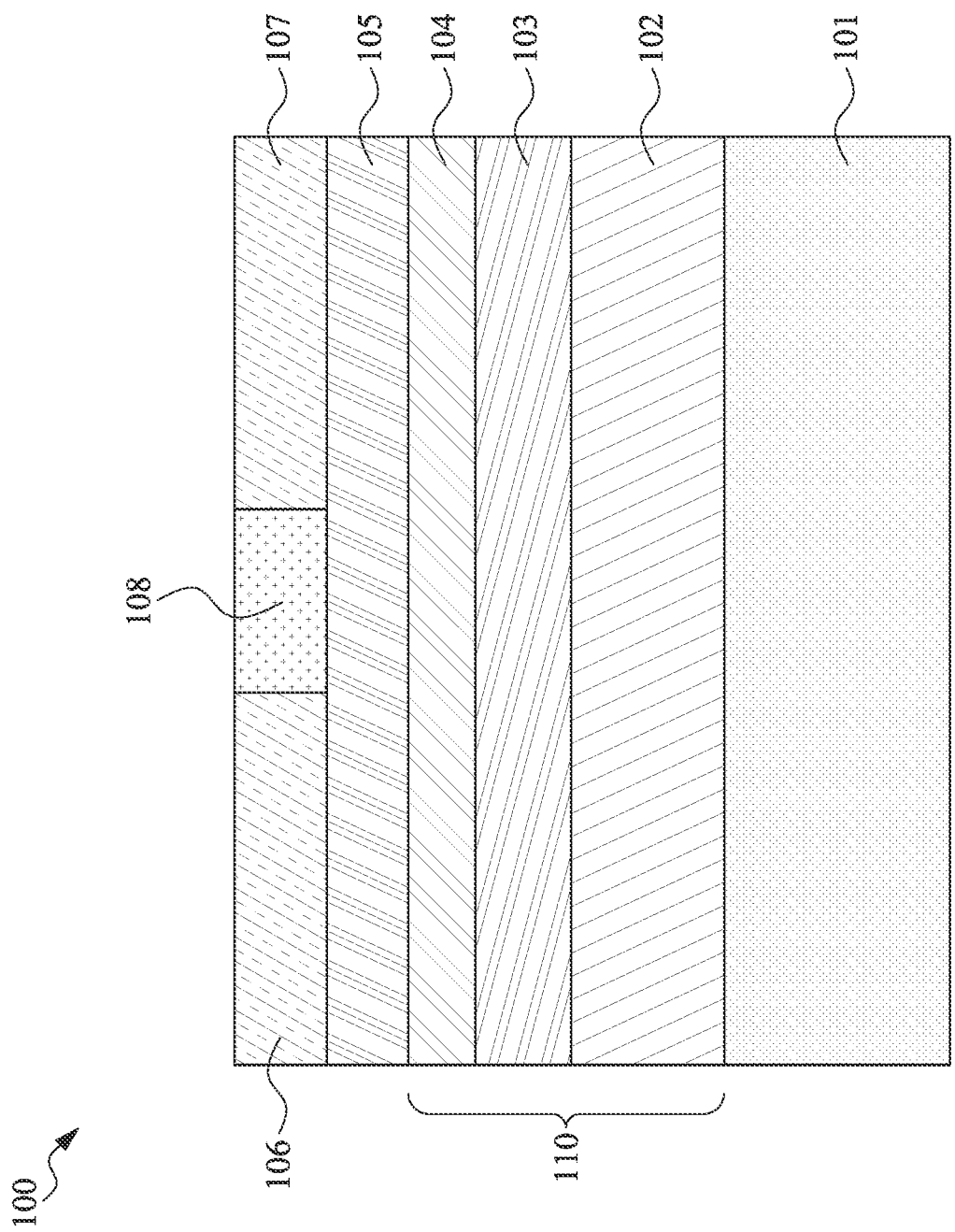
FIG. 1 illustrates cross-sectional views of a ferroelectric field-effect transistor (FeFET) in accordance with the embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some comparative approaches, in a ferroelectric field-effect transistor (FeFET), the ferroelectric (FE) layer of a gate directly contacts with a metal electrode. Similarly, a layer of ferroelectric material in a ferroelectric capacitor is typically sandwiched between a pair of metal electrodes, forming a metal-ferroelectric-metal (MFM) structure. The ferroelectrics have a property of the spontaneous polarization and the polarization can be reversed by a suitably strong applied electric field in the opposite direction. The spontaneous polarization of the ferroelectrics implies a hysteresis effect which can be used as a memory function. Ferroelectric capacitors are indeed used to manufacture ferroelectric RAM (FeRAM) for computers and RFID cards. Typically, ferroelectric materials are used in the form of thin films to allow the field required to switch the polarization.

However, it should be paid special attention to work reliability of the interfaces between metal electrodes and ferroelectric layers when using the thin films. After repetitive electrical cycling, the switchable polarization of the ferroelectric material will decay or disappear. The decrease of switchable polarization in a ferroelectric material causes threshold voltage ($V_{TH}$) shift, which can be referred to as a "fatigue" effect. The polarization fatigue may be resulted from charge injections or defects such as oxygen vacancies due to direct contact of the ferroelectric layer with the metal electrode layer. Therefore, the present disclosure provides a semiconductor device that helps to mitigate the polarization fatigue issue.

Semiconductor devices of ferroelectric field effect transistor (FeFET) are provided in accordance with various exemplary embodiments. The variations of the embodiments are discussed. Throughout the various views and illustrative embodiments, like reference numbers are used to designate like elements.

Embodiments such as those described herein provide a semiconductor device including: a substrate, a gate stack over the substrate, a channel layer over the gate stack, and a source/drain electrode disposed on sides of the gate stack. The gate stack includes a metal gate electrode, a ferroelectric layer, and a (semi)conducting oxide layer disposed between the ferroelectric layer and the metal gate electrode. In various embodiments, the gate stack includes a ferroelectric layer and a (semi)conducting oxide layer as a metal gate electrode. In various embodiments, the semiconductor device has a single gate stack, double gate stacks, or multiple gate stacks, such as fin-like FET (FinFET). In other embodiments, the ferroelectric layer may be alternatively replaced by an anti-ferroelectric layer. The use of the (semi)conducting oxide layer disposed between the ferroelectric layer and the metal gate electrode layer allows formation of FeFET devices with mitigated fatigue issue compared to FeFET devices without the semiconducting oxide layer.

In accordance with yet alternative embodiments of the present disclosure, the semiconductor device may include static random access memory (SRAM) and/or other logic circuits, passive components such as resistors, capacitors, and inductors, and active components such as P-channel field effect transistors (PFET), N-channel FET (NFET), complementary metal-oxide semiconductor (CMOS) device, bipolar transistors, high voltage transistors, high frequency transistors, other memory cells, and combinations thereof. However, further embodiments are applicable to other types of semiconductor devices or components.

FIG. 1 illustrates a cross-sectional view of a semiconductor device of a ferroelectric field-effect transistor (FeFET) device 100 in accordance with some embodiment of the present disclosure. In some embodiments, the FeFET device 100 as mentioned above adopts a bottom-gate structure, but the disclosure is not limited thereto. Referring to FIG. 1, the FeFET device 100 includes a gate stack 110 disposed over a substrate 101. The gate stack 110 includes a metal gate electrode 102 over the substrate 101, an oxide layer 103 over the metal gate electrode 102, and a ferroelectric layer 104 over the oxide layer 103. In alternative embodiments, the gate stack includes a conducting oxide layer as a gate electrode over a substrate and a ferroelectric layer over the conducting oxide layer. In some embodiments, the oxide layer 103 can be a conducting oxide layer. In some embodiments, the oxide layer 103 can be semiconducting oxide layer. The FeFET device 100 further includes a channel layer 105, a source electrode 106 and a drain electrode 107 disposed over the gate stack 110. The source electrode 106 and the drain electrode 107 are separated by an insulating structure 108.

In accordance with some embodiments of the present disclosure, with reference to FIG. 1, the substrate 101 includes silicon (Si). Alternatively, the substrate 101 may include other elementary semiconductor such as germanium (Ge) in accordance with some embodiments of the present disclosure. In some embodiments, the substrate 101 additionally or alternatively includes a compound semiconductor such as silicon carbide (SiC), silicon oxide, gallium arsenic (GaAs), indium arsenide (InAs), and indium phosphide (InP). In some embodiments, the substrate 101 includes an alloy semiconductor such as silicon germanium (SiGe), silicon germanium carbide (SiGeC), gallium arsenic phosphide (GaAsP), and gallium indium phosphide (GaInP).

In accordance with some embodiments of the present disclosure, the substrate 101 may also be in the form of silicon-on-insulator (SOI). Generally, an SOI substrate includes a layer of a semiconductor material (e.g., silicon, germanium and/or the like) formed on an insulator layer. In some embodiments, the insulator layer may be, for example, a buried oxide (BOX) layer or a silicon oxide layer. In some embodiments, other substrates that may be used include multi-layered substrates, gradient substrates, hybrid orientation substrates, any combinations thereof and/or the like. In some embodiments, the substrate 101 includes various p-type doped regions and/or n-type doped regions, such as p-type wells, n-type wells, p-type source/drain features and/or n-type source/drain features, formed by a process such as ion implantation and/or diffusion. The substrate 101 may include other functional features such as a resistor, a capacitor, diode, transistors, such as field effect transistors (FETs). The substrate 101 may include lateral isolation features configured to separate various devices formed on the substrate 101.

In some embodiments, the metal gate electrode 102 may include: Cu, Ag, Au, Al, Ti, Ta, W, Ni, Pt, Ru, Ni, their alloy, compound including nitride.

In accordance with some embodiments of the present disclosure, channel layer 105 may include Si, Ge, or an alloy thereof, III-V semiconductors, II-VI semiconductors, and a metallic oxide with a different proportion of Ga, Al, In, Sn, Cu, Zn, W, and/or Al. In accordance with some embodiments of the present disclosure, the channel layer has a thickness between 1 nm and 30 nm.

In accordance with some embodiments of the present disclosure, the source electrode 105 and the drain electrode 106 are disposed on opposite sides of the channel layer 105 and separated by an insulating structure 108. In some embodiments, the source electrode 105 and the drain electrode 106 include metallic materials. In some embodiments, the source electrode 105 and the drain electrode 106 may be formed by using at least one metal such as aluminum (Al), neodymium (Nd), silver (Ag), chromium (Cr), titanium (Ti), tantalum (Ta), or molybdenum (Mo, or an alloy including the same, or a metal oxide conductive film such as indium tin oxide (ITO).

In accordance with some embodiments of the present disclosure, the insulating structure 108 is disposed to separate the source electrode 105 from and the drain electrode 106 on the channel layer 105. In some embodiments, the insulating structure 108 includes silicon oxide. In some embodiments, the insulating structure 108 includes a high-k dielectric material.

In accordance with some embodiments of the present disclosure, a method for forming the FeFET device 100 may include: providing or receiving the substrate 101; forming the gate stack 110 over the substrate 101; forming the channel layer 105 over the gate stack 110, and forming the source electrode 106 and the drain electrode 107 over the channel layer 105. The method further includes forming the insulating structure 108 to separate the source electrode 106 and the drain electrode 107. The formation of the gate stack 110 includes forming the metal gate electrode 102 over the substrate 101, forming the oxide layer 103 over the metal gate electrode 102, and forming the ferroelectric layer 104 over the oxide layer 103. In alternative embodiments, the formation of the gate stack includes forming a conducting oxide layer as a gate electrode over a substrate and forming a ferroelectric layer over the conducting oxide layer. The oxide layer 103 is disposed between the metal gate electrode 102 and the ferroelectric layer 104. It should be noted that the metal gate electrode 102 and the ferroelectric layer 104 are separated from each other by the oxide layer 103, as shown in FIG. 1.

In accordance with some embodiments of the present disclosure, the metal gate electrode 102 is formed over the substrate 101 and contacts with the (semi)conducting oxide 103. In some embodiments, the metal gate electrode 102 includes a conductive layer having a proper work function. For example, a p-type work function metal (p-metal) includes TiN, TaN and/or a carbon-doped metal nitride such as TaCN, whereas an n-type work function metal (n-metal) includes Ta, TiAl, and/or TiAlN. In accordance with some embodiments of the present disclosure, the metal gate electrode 102 includes other conductive materials, such as silver, aluminum, copper, tungsten, nickel, metal alloys, metal silicide, other suitable materials, or combinations thereof. The metal gate electrode layer 102 may be made of a conductive material, such as metals, metal nitrides, or combinations thereof. In some embodiments, the metal gate electrode 102 can include a single-layered structure. In some alternative embodiments, the metal gate electrode 102 can include a multi-layered structure. In some embodiments, the metal gate electrode may be not necessary in the presence of a conducting oxide as a gate electrode over the substrate.

In accordance with some embodiments of the present disclosure, whether in the top-gate approach or the bottom-gate approach, the oxide layer 103 is disposed between the metal gate electrode 102 and the ferroelectric layer 104. In accordance with some embodiments of the present disclosure, the metal gate electrode 102 and the ferroelectric layer 104 are separated from each other by the oxide layer 103. In some embodiments, the oxide layer can be a conducting oxide layer. In some embodiments, the oxide layer can be semiconducting oxide layer. The oxide layer 103 can mitigate the ferroelectric fatigue of the FeFET semiconductor device by reducing a direct contact with the metal gate electrode 102, which may result in a decrease of switchable polarization in the ferroelectric layer 104.

In some embodiments, the oxide layer 103 may include a semiconductor oxide materials such as, for example but not limited thereto, gallium oxide (GaO), zinc oxide (ZnO), indium oxide (InO), antimony oxide (SbO), copper oxide (CuO), indium antimony oxide (InSbO), aluminum zinc oxide (AlZnO), molybdenum disulfide ($MoS_2$), cadmium oxide (CdO), indium(III) oxide ($In_2O_3$), gallium(III) oxide ($Ga_2O_3$), tin(IV) oxide ($SnO_2$), a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as InGaZnO or IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used. In some embodiments, the oxide layer 103 includes semiconducting oxides, such as $SrRuO_3$, InGaZnO or LaSrMnO.

In accordance with an embodiment of the present disclosure, the oxide layer 103 is an IGZO layer which contains at least four kinds of elements of indium, gallium, zinc, and oxygen, and has a composition ratio (atomic percentage) of indium as twice or more as a composition ratio of gallium and a composition ratio of zinc. The IGZO layer can be formed by a sputtering or atomic layer deposition (ALD) method with an oxide target having a composition ratio of indium:gallium:zinc=3:1:2, 1:1:1, or other ratios.

In accordance with some embodiments of the present disclosure, the oxide layer 103 is non-single-crystal and may be either amorphous or polycrystalline. Further, the oxide layer 103 may have either an amorphous structure including a portion having crystallinity or a non-amorphous structure. In some embodiments, when the oxide layer 103 is in an amorphous state, a flat surface can be obtained with relative ease, so that when a transistor is manufactured with the use of the oxide layer 103, interface scattering can be reduced, and relatively high mobility can be obtained with relative ease.

In accordance with some embodiments of the present disclosure, in the oxide layer 103 having crystallinity, defects in the bulk can be further reduced and when a surface flatness is improved, mobility higher than that of an oxide layer 103 in an amorphous state can be obtained. In order to improve the surface flatness, the oxide layer 103 is preferably formed over a flat surface. Specifically, the oxide layer 103 may be formed over a surface with the average surface roughness (Ra) of less than or equal to 1 nm, preferably less than or equal to 0.3 nm, more preferably less than or equal to 0.1 nm. The thickness of each of the oxide layer 103 is preferably 2 nm to 50 nm.

In accordance with some embodiments of the present disclosure, the ferroelectric layer 104 is disposed between the oxide layer 103 and the channel layer 105. In accordance with an embodiment of the present disclosure, at least a portion of the ferroelectric layer 104 is disposed between the oxide layer 103 and the metal gate electrode 102. The ferroelectric layer 104 includes electric dipoles and can be electrically charged to form a charged layer with fixed charge. The adjacent oxide 103 can stabilize oxygen vacancies of the ferroelectric layer 104 and can reduce charge injections from the metal gate electrode 102 so as to mitigate the ferroelectric fatigue of the FeFET semiconductor device in accordance with the present disclosure.

In accordance with some embodiments of the present disclosure, the ferroelectric layer 104, as-deposited without being annealed, may, or may not, have the ferroelectric property. However, it is still referred to as a ferroelectric layer since the ferroelectric property will be achieved in subsequent processes. In some embodiments, the ferroelectric layer 104 has a crystalline structure. In some embodiments, the ferroelectric layer 104 has a thickness between approximately 5 nm and approximately 20 nm. The exemplary materials of ferroelectric layer 104 include HfSiOx, HfZrOx, $Al_2O_3$, $TiO_2$, $LaO_x$, $BaSrTiO_x$ (BST), $PbZr_xTi_yO_z$ (PZT), $BiFeO_3$ (BFO) or $(PbLa)(ZrTi)O_3$ (PLZT), or the like, wherein value x, y and z are independently greater than zero and smaller than 1. The ferroelectric layer 104 may be formed using physical vapor deposition (PVD) or atomic layer deposition, which may be formed at a wafer temperature between approximately 25° C. and approximately 400° C.

Figure 2:
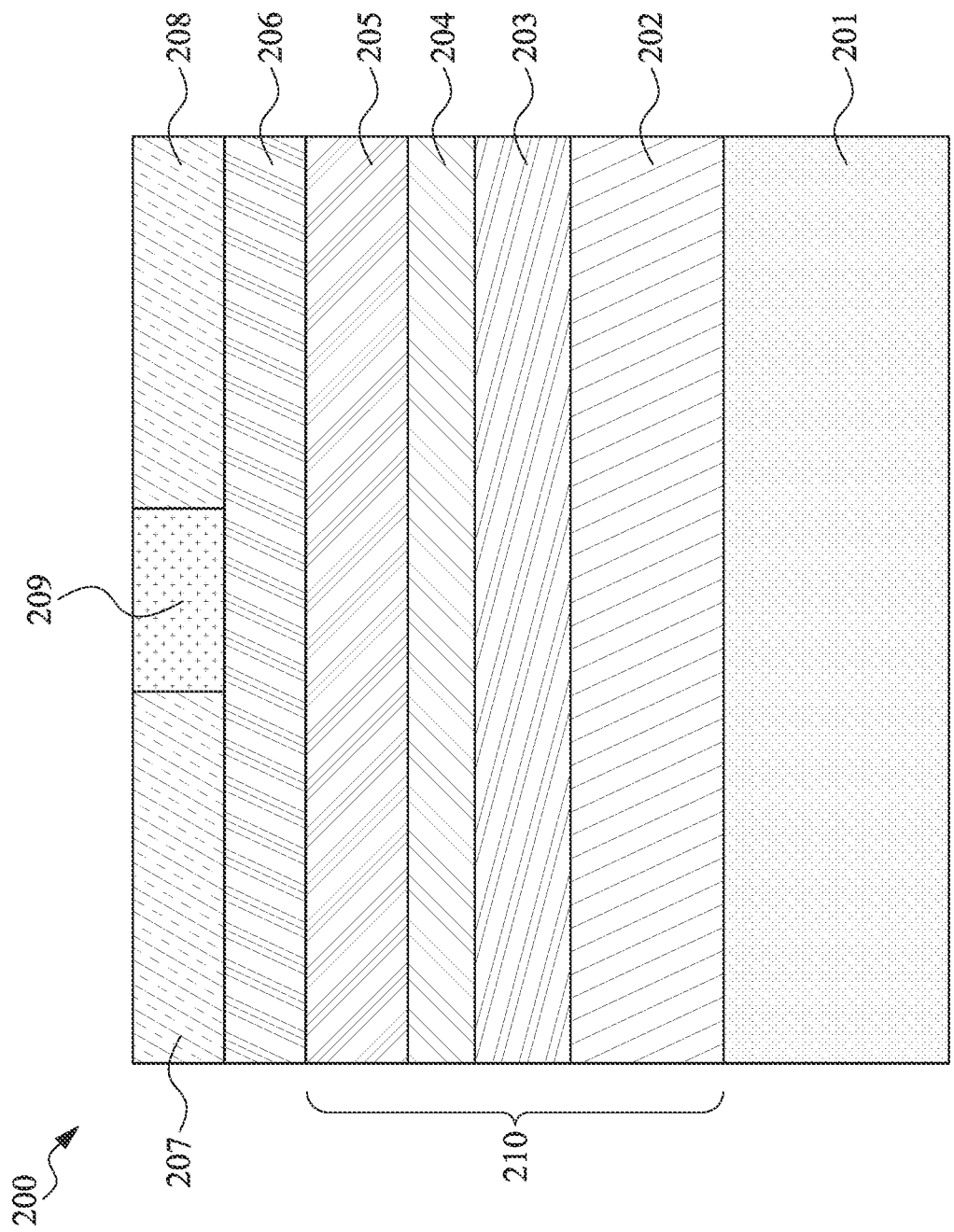
FIG. 2 illustrates cross-sectional views of a Ferroelectric field-effect transistor (FeFET) in accordance with the embodiment of the present disclosure.

FIG. 2 illustrates a cross-sectional view of a semiconductor device of a ferroelectric field-effect transistor (FeFET) device 200 in accordance with some embodiment of the present disclosure. In some embodiments, the FeFET device 200 as mentioned above adopts a bottom-gate structure, but the disclosure is not limited thereto. Referring to FIG. 2, the FeFET device 200 includes a gate stack 210 disposed over a substrate 201. In some embodiments, the gate stack 210 includes a metal gate electrode 202 over the substrate 201, an oxide 203 over the metal gate electrode 202, a ferroelectric layer 204 over the oxide layer 203 and a high-k dielectric layer 205 over the ferroelectric layer 204. In some embodiments, the oxide layer 203 can be a conducting oxide layer. In alternative embodiments, the gate stack includes a conducting oxide as a gate electrode over the substrate, a ferroelectric layer over the conducting oxide layer and a high-k dielectric layer over the ferroelectric layer. In some embodiments, the oxide layer 203 can be semiconducting oxide layer. The FeFET device 200 further includes a channel layer 206, a source electrode 207 and a drain electrode 208 disposed on the sides of the gate stack 210. The source electrode 207 and the drain electrode 208 are separated by an insulating structure 209. In some embodiments, the insulating structure 209 includes silicon oxide. In some embodiments, the insulating structure 209 includes a high-k dielectric material.

In accordance with some embodiments of the present disclosure, the substrate 201, the metal gate electrode 202, the semiconducting oxide 203, the ferroelectric layer 204, the source electrode 207 and the drain electrode 208 may respectively have the same materials as the substrate 101, the metal gate electrode 102, the oxide 103, the ferroelectric layer 104, the source electrode 106 and the drain electrode 107 as described above; therefore, those details are omitted in the interest of brevity.

In accordance with some embodiments of the present disclosure, the high-k dielectric layer 205 may include a high-k dielectric material, which is a dielectric material having the dielectric constant higher than that of thermal silicon oxide, approximately 3.9. The high-k dielectric material can be formed by a suitable process such as atomic layer deposition (ALD). Other methods to form the high-k dielectric 205 include metal-organic chemical vapour deposition (MOCVD), Plasma Enhance Chemical Vapor Deposition (PECVD), physical vapor deposition (PVD), UV-Ozone Oxidation or molecular beam epitaxy (MBE).

In some embodiments, some of the candidate materials (such as $HfO_2$, $HfSiO_x$, $HfZrO_x$, $Al_2O_3$, $TiO_2$, and $LaO_x$) of the ferroelectric materials include the same elements as some high-k dielectric materials. Alternatively, the ferroelectric materials may have different properties than high-k dielectric materials. For example, the ferroelectric materials may have a resistivity lower than the respective high-k dielectric materials that contain the same type of elements.

In accordance with some embodiments of the present disclosure, the semiconductor device is directed to a ferroelectric capacitor.

Figure 3:
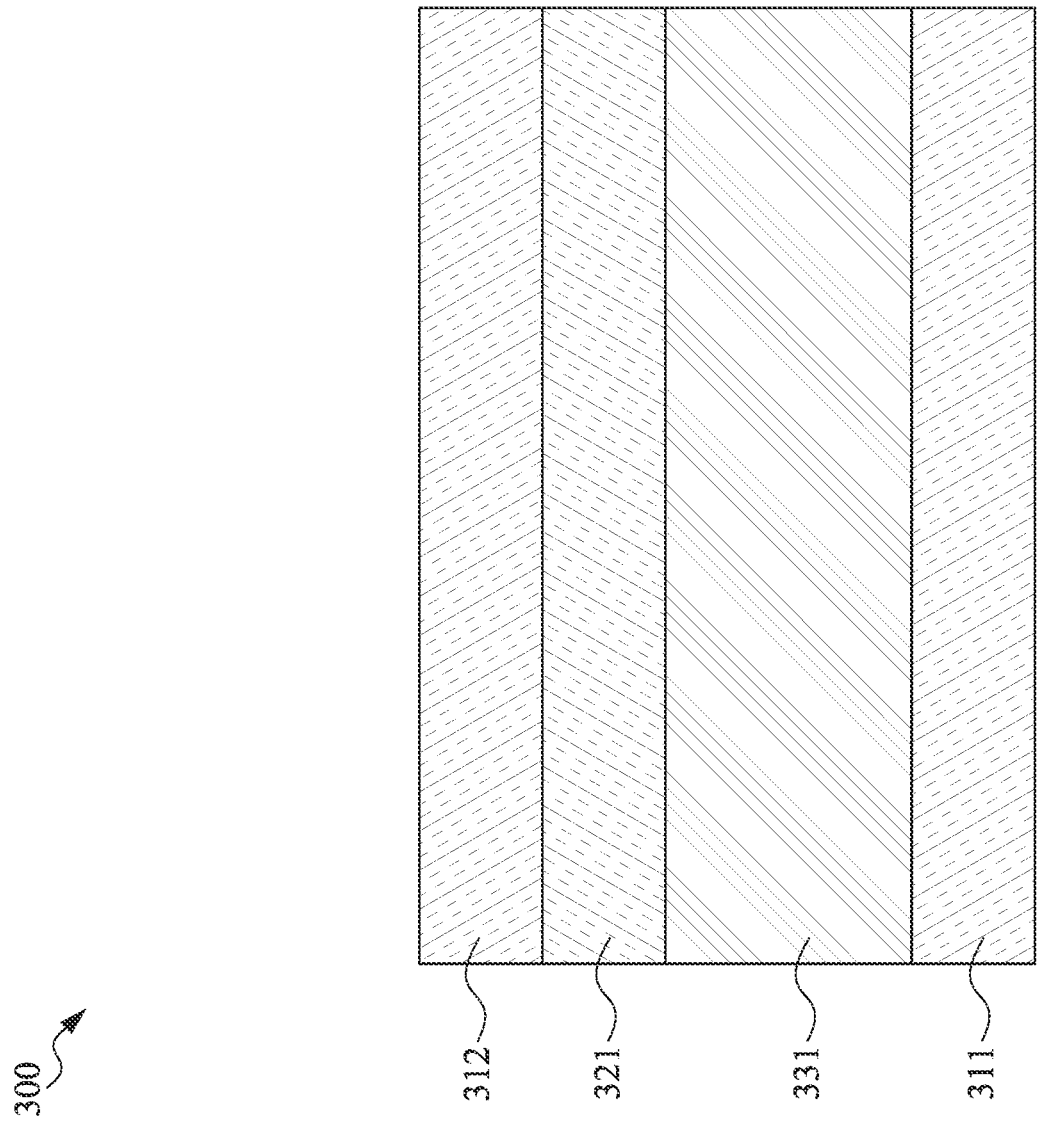
FIG. 3 illustrates a structure of ferroelectric capacitor in accordance with the embodiment of the present disclosure.

FIG. 3 illustrates an embodiment of a ferroelectric capacitor 300 in accordance with the present disclosure. The ferroelectric capacitor 300 has a first electrode layer 311, a second electrode layer 312, an oxide layer 331, and a ferroelectric layer 321. As mentioned above, the oxide layer 331 can be a conducting oxide layer 331 or a semiconductor oxide layer 331. The ferroelectric layer 321 is disposed between the first electrode layer 311 and the second electrode layer 312, while the semiconducting oxide layer 331 is further disposed between the first electrode layer 311 and the ferroelectric layer 321. In accordance with yet alternative embodiments of the present disclosure, the semiconducting oxide layer 331 can be disposed between the second electrode layer 312 and the ferroelectric layer 321, though not shown. In such embodiments, the ferroelectric layer 312 is separated from at least the first electrode layer 311 or the second electrode layer 312.

Figure 4:
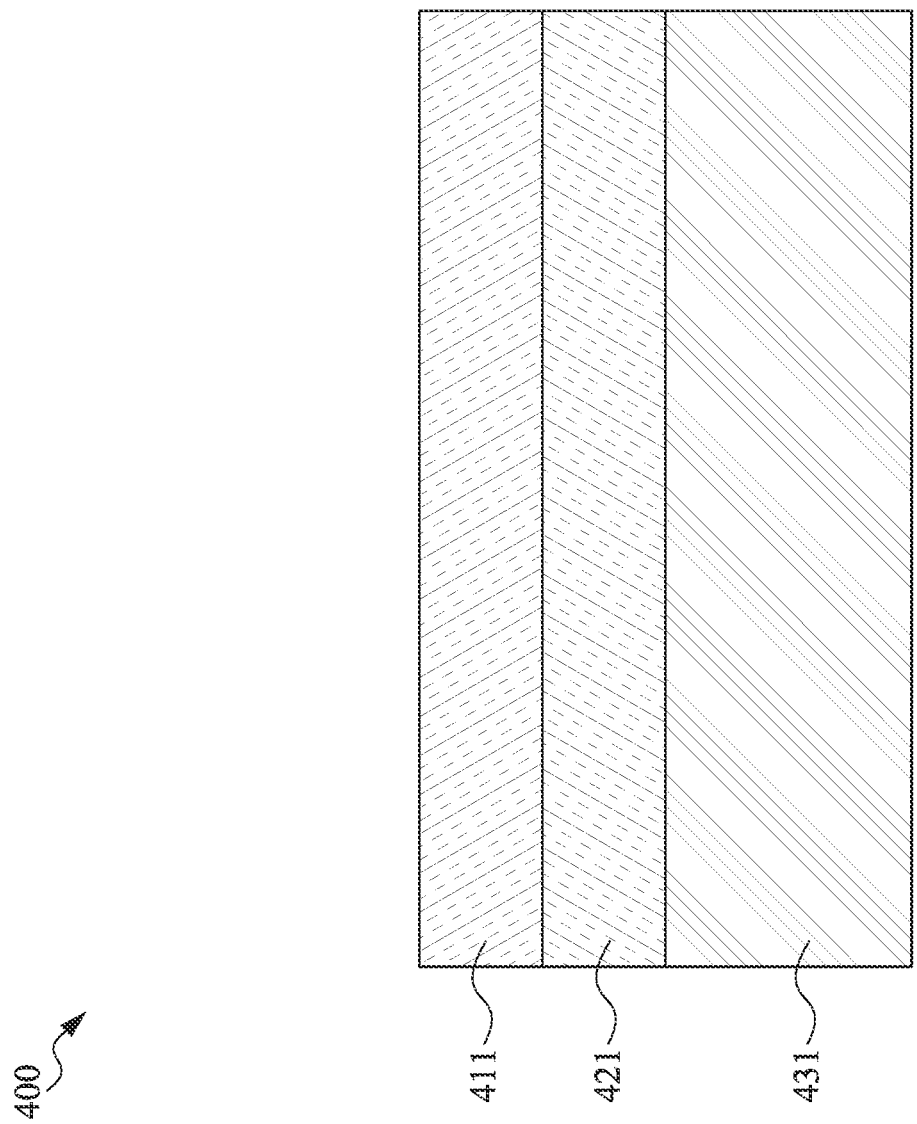
FIG. 4 illustrates a structure of ferroelectric capacitor in accordance with the embodiment of the present disclosure.

FIG. 4 illustrates an embodiment of a ferroelectric capacitor 400 in accordance with the present disclosure. In some embodiment, a first electrode layer has the same material as a semiconducting oxide layer to form a semiconducting oxide electrode layer 431. In such embodiment, the ferroelectric capacitor 400 has the semiconducting oxide electrode layer 431, a second electrode layer 411, and a ferroelectric layer 421. Further, the ferroelectric layer 421 is disposed between the semiconducting oxide electrode layer 431 and the second electrode layer 411.

Figure 5:
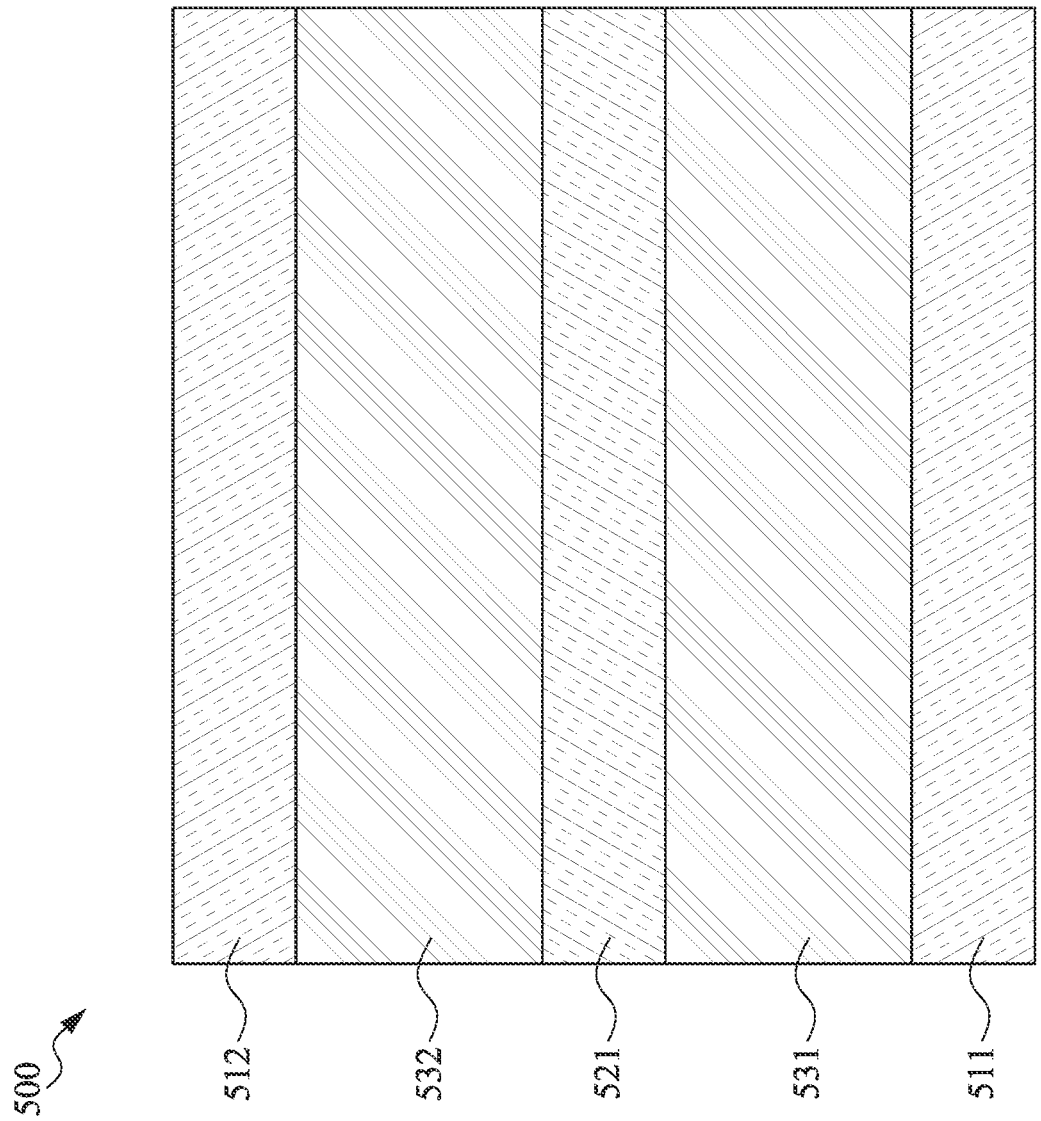
FIG. 5 illustrates a structure of ferroelectric capacitor in accordance with the embodiment of the present disclosure.

FIG. 5 illustrates an embodiment of a ferroelectric capacitor 500 in accordance with the present disclosure. The ferroelectric capacitor has a first electrode layer 511, a second electrode layer 512, a first oxide layer 531, a second oxide layer 532 and a ferroelectric layer 521. The first oxide layer 531 and the second oxide layer 532 can be a conducting oxide layer or a semiconductor oxide layer. In some embodiments, the first semiconducting oxide layer 531 and the second semiconducting oxide layer 532 can include a same material, but the disclosure is not limited thereto. It should be noted that the first semiconducting oxide layer 531 is disposed between the first electrode layer 511 and the ferroelectric layer 521, while the second semiconducting oxide layer 532 is disposed between the second electrode layer 512 and the ferroelectric 521. Accordingly, the ferroelectric layer 512 is separated from both of the first and second electrode layers 511 and 512 by the first and second semiconducting oxide layers 531 and 532.

Figure 6:
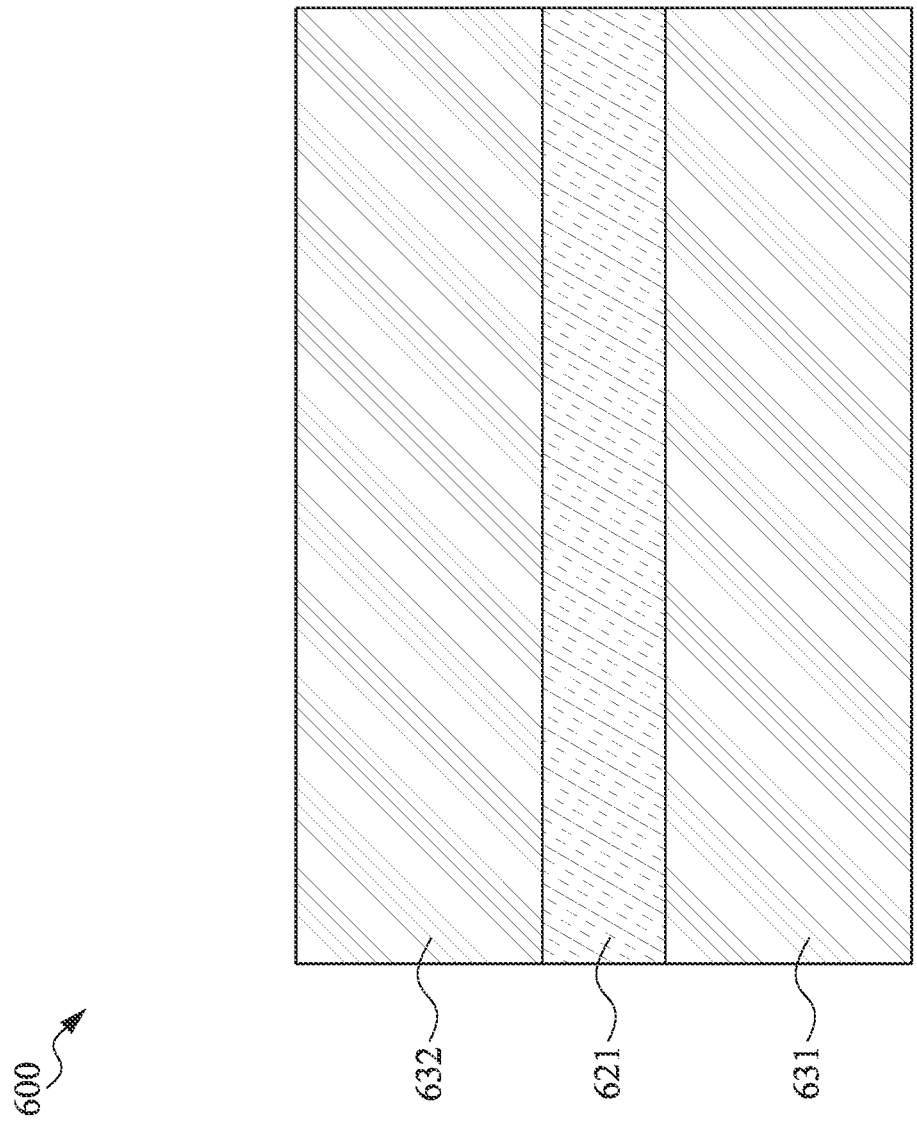
FIG. 6 illustrates a structure of ferroelectric capacitor in accordance with the embodiment of the present disclosure.

FIG. 6 illustrates an embodiment of a ferroelectric capacitor 600 in accordance with the present disclosure. In the embodiment, a first electrode layer has the same material as a semiconducting oxide layer to form a first semiconducting oxide electrode layer 631, and a second electrode layer has the same material as a second semiconducting oxide layer to form a second semiconducting oxide electrode layer 632. In such embodiment, the ferroelectric capacitor 600 has the first semiconducting oxide electrode layer 631, the second semiconducting oxide electrode layer 632, and a ferroelectric layer 621. The ferroelectric layer 621 is disposed between the first semiconducting oxide electrode layer 631 and the second semiconducting oxide electrode layer 632.

Figure 7:
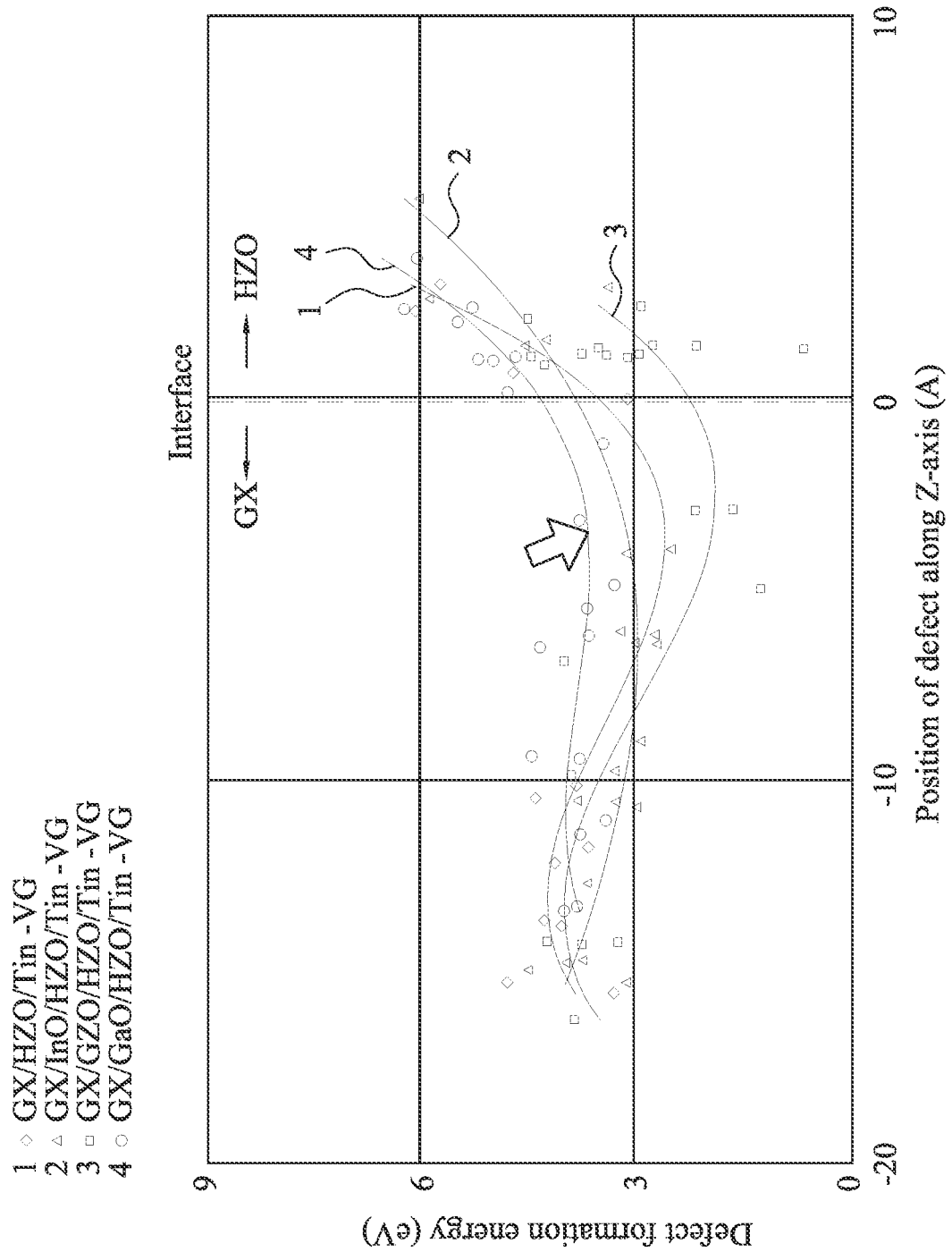
FIG. 7 illustrates the simulated results of the endurance of a device in accordance with the embodiment of the present disclosure.

FIG. 7 shows that a device in accordance with the embodiment of the present disclosure may be further improved in terms of endurance. The result shown in FIG. 7 is obtained on the basis of theoretical calculation of the structures by first-principle density-functional simulation, and it shows that a device according to the embodiment of the present disclosure can be further improved by an optimized oxide/ferroelectric interface, which prevents defect formation around the interface to improve the device endurance. In the structures, TiN is used as the metal, $HfZrO_2$ is used as the ferroelectric material, and $InGaZnO_4$ (GX) is used as the oxide, and the term (such as GaO, InO and GZO) between GX and HZO means a dominant component of GX near the interface. In principle, defect formation energy (y-axis) is associated with the possibility of defect formation, that is, the higher formation energy is, the lower possibility of defect formation is. In other words, if the defect formation energy is low, defects are easier to form and gather around the interface. The x-axis of FIG. 7 means a distance from the material interface, and the zero point of the x-axis (shown as a vertical dash line) means the interface between GX and HZO materials. As can be seen from FIG. 7, compared to the non-optimized interface of the GX/HZO/TiN structure (line 1) and the interface of the GX/InO/HZO/TiN or GX/GZO/HZO/TiN structures (lines 2 and 3, respectively), the interface of the GX/GaO/HZO/TiN structure (line 4) exhibits a relatively higher defect formation energy around the interface. This means that defects issue in the GX/GaO/HZO/TiN structure is mitigated. In some embodiments, it is found that even if the defects are formed, the defects are distributed evenly in the device rather than being gathered near the interface.

Figure 8:
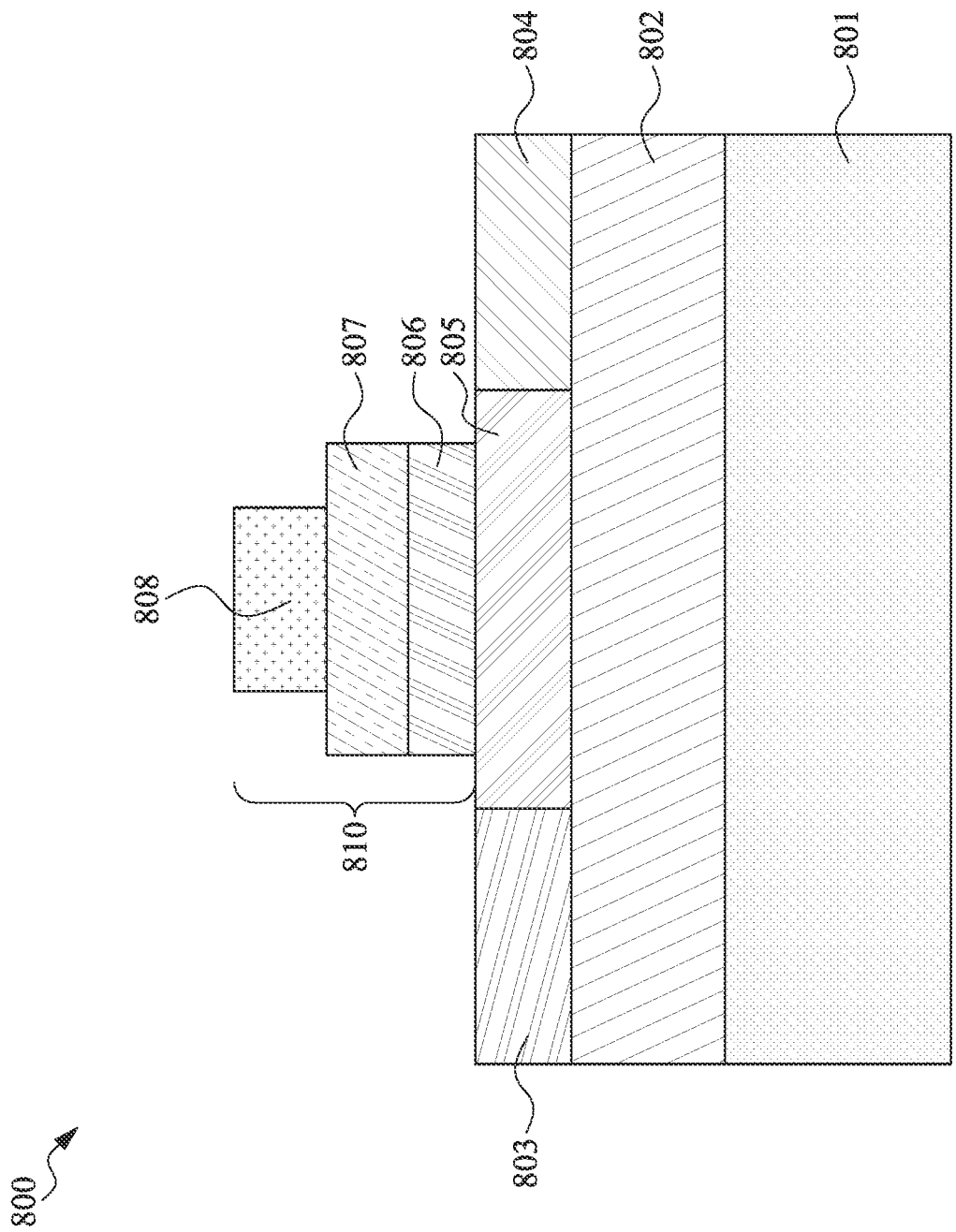
FIG. 8 illustrates cross-sectional views of a ferroelectric field-effect transistor (FeFET) in accordance with the embodiment of the present disclosure.

In accordance with some embodiments of the present disclosure, the FeFET device adopts a top-gate structure, but the disclosure is not limited thereto. FIG. 8 illustrates an embodiment of a FeFET device 800 in accordance with the present disclosure, which adopts a top-gate structure. In the embodiment, the top-gate structure includes a substrate 801, a buffer layer 802, a source electrode 803 and a drain electrode 804 disposed over the buffer layer 802, a channel region 805 disposed between the source and drain electrodes, and a gate stack 810 over the source and drain electrodes 803 and 804. The gate stack 810 includes a ferroelectric layer 806 over the source electrode 803, the drain electrode 804 and the channel region 805, a metal electrode 808 and a semiconducting oxide layer 807 between the ferroelectric layer 806 and the metal gate electrode 808. In various embodiments, the gate stack 810 includes a ferroelectric layer 806 over the source and drain electrodes 803 and 804, and a semiconducting oxide layer serving as a gate electrode.

Figure 9:
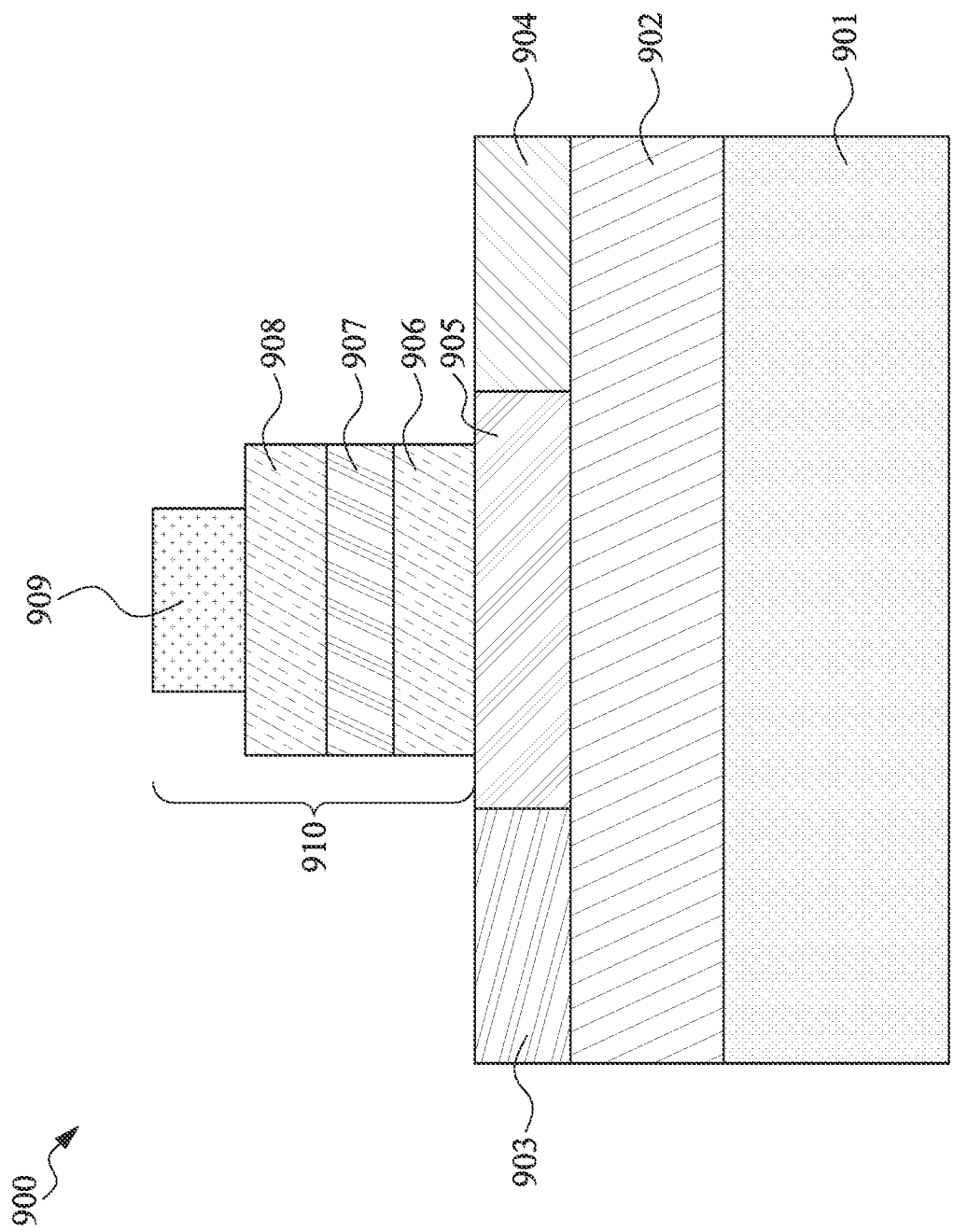
FIG. 9 illustrates cross-sectional views of a Ferroelectric field-effect transistor (FeFET) in accordance with the embodiment of the present disclosure.

FIG. 9 illustrates an alternative embodiment of a FeFET device 900 in accordance with the present disclosure, which adopts a top-gate structure. In the embodiment, the top-gate structure includes a substrate 901, a buffer layer 902, a source electrode 903 and a drain electrode 904 disposed over the buffer layer 902, a channel region 905 disposed between the source and drain electrodes, and a gate stack 910 over the source and drain electrodes 903 and 904. The gate stack 910 includes a semiconducting oxide layer 906 over the source and drain electrodes 903 and 904 and the channel region 905, a ferroelectric layer 907 over the semiconducting oxide layer 906, a semiconducting oxide layer 908 over the ferroelectric layer 907 and a metal gate electrode 909. In various embodiments, the gate stack 910 includes a semiconducting oxide layer 906, a ferroelectric layer 907 over the semiconducting oxide layer 906, and a semiconducting oxide layer 908 serving as a gate electrode over the ferroelectric layer 907.

The buffer layer 802/902, in some embodiments, is epitaxially grown on the substrate 801/901. The epitaxial growth can use Metal-Organic Chemical Vapor Deposition (MOCVD), Molecular Beam Epitaxy (MBE), Liquid Phase Epitaxy (LPE), Vapor Phase Epitaxy (VPE), Ultra-High-Vacuum Chemical Vapor Deposition (UHVCVD), the like, or a combination thereof. The buffer layer can be a group IV material, such as Si, Ge, SiGe, SiGeSn, or the like; a group III-group V compound material, such as GaAs, GaP, GaAsP, AlInAs, AlGaAs, GaInAs, InAs, GaInP, InP, InSb, GaInAsP or the like; or the like.

In some embodiments of the FeFET device adopting a top-gate structure, the formation of the source structure and the drain structure includes applying, exposing, and developing a photoresist layer. The desirable structure for forming source structure and the drain structure is exposed through the photoresist layer. In some embodiments, an implantation is then performed to implant an n-type impurity, such as phosphorous, arsenic, antimony, or combinations thereof to form source structure and the drain structure. In some alternative embodiments, an implantation is performed to implant a p-type impurity, such as boron, indium, or combinations thereof to form drain structure and the drain structure.

In accordance with some embodiments of the present disclosure, a method including: providing a substrate; forming a buffer layer over the substrate, forming a source electrode and a drain electrode over the buffer layer; forming a gate stack over the source and drain electrodes, is provided. The formation of the gate stack includes forming a ferroelectric layer over the source and drain electrodes, forming a semiconducting oxide layer over the ferroelectric layer, and forming a metal gate electrode over the semiconducting oxide layer. In alternative embodiments, the formation of the gate stack further includes forming a semiconducting oxide layer between the ferroelectric layer and the source and drain electrodes. In yet alternative embodiments, the formation of the gate stack includes forming a ferroelectric layer over the source and drain electrodes, and forming a semiconducting oxide layer as a gate electrode over a ferroelectric layer. It should be noted that the metal gate electrode and the ferroelectric layer are separated from each other by the semiconducting oxide layer.

The disclosed technique is directed to a laminated structure including a ferroelectric layer, an electrode layer over the ferroelectric layer and a semiconducting oxide layer disclosed between the ferroelectric layer and the electrode layer.

In some embodiments according to the present disclosure, the laminated structure further includes a channel layer and a source/drain electrode, wherein the channel layer is between the source/drain electrode and the ferroelectric layer. In some embodiments according to the present disclosure, the source/drain electrode is disposed over the ferroelectric layer and the channel layer. In accordance with yet alternative embodiments of the present disclosure, the source/drain electrode is disposed under the ferroelectric layer, and in a substrate.

In some embodiments according to the present disclosure, the laminated structure further includes a second electrode layer, wherein the ferroelectric layer and the semiconducting oxide layer are between the first electrode layer and the second electrode layer.

In an embodiment, the laminated structure is part of a gate electrode of a transistor device. The transistor device has a silicon channel formed on a silicon-on-insulator substrate, and a gate structure at least partially over the silicon channel. The gate structure may include a high-k gate dielectric layer, e.g., of $HfO_2$, and a laminated structure over the high-k gate dielectric layer. The laminated structure includes a vertical stack of TiN, ferroelectric $ZrO_2$, TiN, and Pt. In combination with a nanoscale silicon strip configured as a junctionless transistor, the laminated gate stack enables a subthreshold swing ("SS") less than 60 mV/dec operated at a relatively large Vds of approximately 1V.

The thickness of the ferroelectric layer as mentioned above can be varied to modify the parameters of one or more of the resistance component, inductance component, or capacitance component of the laminated structure. For example, a thicker ferroelectric layer in the laminated structure brings approximately a larger resistance value of the resistance component and a lower capacitance value of the capacitance component. The thickness of the ferroelectric layer also affects the multi-domain characteristics of the laminated structure. In an example, an area size of the Pt metal layer affects the capacitance value of the laminated. The capacitance value of laminated structure increases with enlarged area size of the Pt metal layer.

With the proper C, L, or R values, a laminated structure as described here may be used for various circuit applications, like LC resonant circuit, band-pass circuit, band-stop circuit, low-pass filter, high-pass filter, oscillators, or negative capacitors.

In the present disclosure, a ferroelectric-based semiconductor device, capacitor or laminated structure with improvement is disclosed. In accordance with the present disclosure, a semiconducting oxide layer is disposed adjacent to a ferroelectric layer so as to preventing from charges injected from a metal electrode, thereby mitigating ferroelectric fatigue. In addition, the semiconducting oxide can prevent from trapping of injected charges and stabilize oxygen vacancies in the ferroelectric layer. Hence, ferroelectric-based semiconductor device, capacitor or laminated structure can significantly improve the fatigue property of a ferroelectric layer and maintain the switchable polarization of the ferroelectric material.

In the present disclosure, a semiconductor device is disclosed. The semiconductor device includes: a gate stack and a channel layer over the gate stack. In some embodiments, the gate stack includes: a metal gate electrode, a ferroelectric layer, and a semiconducting oxide layer disposed between the ferroelectric layer and the metal gate electrode. In some embodiments, the semiconducting oxide layer includes $SrRuO_3$, InGaZnO (IGZO) or LaSrMnO.

In the present disclosure, a ferroelectric capacitor is disclosed. The ferroelectric capacitor includes: a first semiconducting oxide electrode layer, a second semiconducting oxide electrode layer, a ferroelectric layer between the first semiconducting oxide electrode layer and the second semiconducting oxide electrode layer, and a first semiconducting oxide layer disposed between the ferroelectric layer and the second semiconducting oxide electrode layer.

In the present disclosure, a laminated structure is disclosed. The laminated structure includes a ferroelectric layer, an electrode layer over the ferroelectric layer, and a semiconducting oxide electrode layer; wherein the ferroelectric layer is between the electrode layer and the semiconducting oxide electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including:
a gate stack including:
a metal gate electrode;
a ferroelectric layer; and
a semiconducting oxide layer disposed between the ferroelectric layer and the metal gate electrode, wherein the semiconducting oxide layer includes $SrRuO_3$, InGaZnO (IGZO) or LaSrMnO; and
a channel layer over the gate stack.

2. The semiconductor device of claim 1, wherein the semiconducting oxide layer has a thickness between approximately 1 µm and approximately 30 µm.

3. The semiconductor device of claim 1, wherein the ferroelectric layer includes a ferroelectric material including $HfSiO_x$, $HfZrO_x$, $Al_2O_3$, $TiO_2$, $LaO_x$, $BaSrTiO_x$ (BST), $PbZr_xTi_yO_z$ (PZT), $BiFeO_3$ (BFO) or $(Pb_vLa_w)(Zr_xTi_y)O_z$ (PLZT), or a combination thereof.

4. The semiconductor device of claim 1, further comprising a high-k dielectric layer disposed between the ferroelectric layer and the channel layer.

5. The semiconductor device of claim 1, wherein the ferroelectric layer is over the semiconducting oxide electrode layer.

6. A ferroelectric capacitor, including:
a first semiconducting oxide electrode layer,
a second semiconducting oxide electrode layer;
a ferroelectric layer between the first semiconducting oxide electrode layer and the second semiconducting oxide electrode layer, and
a first semiconducting oxide layer disposed between the ferroelectric layer and the second semiconducting oxide electrode layer,
wherein the first semiconducting oxide electrode layer includes SrRuO3, InGaZnO (IGZO) or LaSrMnO.

7. The ferroelectric capacitor of claim 6, wherein the second semiconducting oxide electrode layer includes $SrRuO_3$, InGaZnO (IGZO) or LaSrMnO.

8. The ferroelectric capacitor of claim 6, wherein the second semiconducting oxide electrode layer has the same material as the first semiconducting oxide electrode layer.

9. The ferroelectric capacitor of claim 6, wherein the ferroelectric layer includes a ferroelectric material including $HfSiO_x$, $HfZrO_x$, $Al_2O_3$, $TiO_2$, $LaO_x$, $BaSrTiO_x$, (BST), $PbZr_xTi_yO_z$ (PZT), $BiFeO_3$ (BFO) or $(Pb_vLa_w)(Zr_xTi_y)O_z$ (PLZT), or a combination thereof.

10. The ferroelectric capacitor of claim 6, wherein the first semiconducting oxide electrode layer has a thickness between approximately 1 µm and approximately 30 µm.

11. The ferroelectric capacitor of claim 6, wherein the ferroelectric layer is separated from at least the first semiconducting oxide electrode layer or the semiconducting oxide second electrode layer.

12. The ferroelectric capacitor of claim 6, wherein the ferroelectric layer is over the first semiconducting oxide layer.

13. A laminated structure including:
a ferroelectric layer;
an electrode layer over the ferroelectric layer;
a semiconducting oxide electrode layer; wherein the ferroelectric layer is between the electrode layer and the semiconducting oxide electrode layer,
wherein the semiconducting oxide electrode layer includes $SrRuO_3$, InGaZnO (IGZO) or LaSrMnO.

14. The laminated structure of claim 13, wherein the semiconducting oxide electrode layer has a thickness between approximately 1 µm and approximately 30 µm.

15. The laminated structure of claim 13, further including:
a channel layer; and
a source/drain electrode, wherein the channel layer is disposed between the source/drain electrode and the ferroelectric layer.

16. The laminated structure of claim 15, further comprising a high-k dielectric layer disposed between the ferroelectric layer and the channel layer.

17. The laminated structure of claim 15, wherein the source electrode and the drain electrode are separated by an insulating structure.

18. The laminated structure of claim 13, wherein the ferroelectric layer includes a ferroelectric material including $HfSiO_x$, $HfZrO_x$, $Al_2O_3$, $TiO_2$, $LaO_x$, BaSrTiO), (BST), $PbZr_xTi_yO_z$ (PZT), $BiFeO_3$ (BFO) or $(Pb_vLa_w)(Zr_xTi_y)O_z$ (PLZT), or a combination thereof.

19. The laminated structure of claim 13, wherein the ferroelectric layer is over the semiconducting oxide electrode layer.

20. The ferroelectric capacitor of claim 13, wherein the ferroelectric layer is separated from the electrode layer.

* * * * *